(12) United States Patent
Hou

(10) Patent No.: US 9,674,987 B2
(45) Date of Patent: Jun. 6, 2017

(54) HEAT DISSIPATION DEVICE

(71) Applicant: ZTE Corporation, Shenzhen (CN)

(72) Inventor: Fangxi Hou, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 14/892,460

(22) PCT Filed: Nov. 13, 2013

(86) PCT No.: PCT/CN2013/087055
§ 371 (c)(1),
(2) Date: Nov. 19, 2015

(87) PCT Pub. No.: WO2014/187083
PCT Pub. Date: Nov. 27, 2014

(65) Prior Publication Data
US 2016/0106006 A1 Apr. 14, 2016

(30) Foreign Application Priority Data

May 20, 2013 (CN) .................... 2013 2 0273890 U

(51) Int. Cl.
H01R 13/00 (2006.01)
H05K 7/20 (2006.01)
H01R 12/72 (2011.01)

(52) U.S. Cl.
CPC ....... *H05K 7/20509* (2013.01); *H01R 12/722* (2013.01); *H05K 7/20418* (2013.01)

(58) Field of Classification Search
CPC .... H01L 23/4006; F21V 29/004; F21V 23/06; F21Y 2101/02; H05K 7/20
(Continued)

(56) References Cited

U.S. PATENT DOCUMENTS 5,659,458 A * 8/1997 Patchen .............. H01L 23/3677
257/678
5,659,459 A * 8/1997 Wakabayashi ......... B41J 29/377
174/51

(Continued)

FOREIGN PATENT DOCUMENTS

| CN | 200962703 Y | 10/2007 |
| CN | 201213333 Y | 3/2009 |
| CN | 101841994 A | 9/2010 |

OTHER PUBLICATIONS

International Search Report for corresponding application PCT/CN2013/087055 filed Nov. 13, 2013; Mail date Feb. 27, 2014.
(Continued)

*Primary Examiner* — Abdullah Riyami
*Assistant Examiner* — Vladimir Imas
(74) *Attorney, Agent, or Firm* — Cantor Colburn LLP

(57) ABSTRACT

Provided is a heat dissipation device. The heat dissipation device includes a thermal conductive plate (1), a shape of which is the same as a shape of a Secure Digital (SD) card. The thermal conductive plate (1) is used to be inserted into an SD card connector, and partially contacts with at least one inner surface of the SD card connector; the thermal conductive plate (1) is made of thermal conductive metallic material, and one or more contacting parts (10) of the thermal conductive plate (1) that contact with the SD card connector are set to be thermal conductive metallic material, and outer surfaces (12), other than the one or more contacting parts (10), of the thermal conductive plate (1) are set to be insulating material. The present technical solution solves the problem that the implementing effect of heat dissipation schemes already existed for terminals is fairly bad in the related technologies, and improves heat conduction and heat dissipation speed. The heat dissipation device occupies less (Continued)

space in the terminal, and enhances heat dissipation efficiency.

4 Claims, 4 Drawing Sheets

(58) Field of Classification Search
USPC .................... 439/487, 485; 361/700, 737
See application file for complete search history.

(56) References Cited

U.S. PATENT DOCUMENTS

| | | | | |
|---|---|---|---|---|
| 5,940,269 A * | 8/1999 | Ko | .................. | H01L 23/467 |
| | | | | 165/122 |
| 6,157,538 A * | 12/2000 | Ali | .................. | H05K 7/20445 |
| | | | | 165/185 |
| 7,290,401 B2 * | 11/2007 | Hermerding | ............ | G06F 1/206 |
| | | | | 236/49.3 |
| 7,952,873 B2 * | 5/2011 | Glahn | .................. | H05K 7/1404 |
| | | | | 165/104.33 |
| 8,159,819 B2 * | 4/2012 | Memon | .................. | G06F 1/20 |
| | | | | 165/185 |
| 8,199,524 B2 * | 6/2012 | Chikazawa | ............ | G06F 1/1626 |
| | | | | 361/799 |
| 8,861,191 B1 * | 10/2014 | Yu | .................. | G06F 1/1601 |
| | | | | 361/679.06 |
| 2003/0047103 A1 | 3/2003 | Rabin | | |
| 2005/0194876 A1 * | 9/2005 | Shimada | .............. | A61B 1/0638 |
| | | | | 313/110 |
| 2005/0270741 A1 * | 12/2005 | Wang | .................. | H01L 23/367 |
| | | | | 361/695 |
| 2006/0005945 A1 * | 1/2006 | Wei | .................. | H01L 23/467 |
| | | | | 165/80.3 |
| 2006/0221569 A1 * | 10/2006 | Liu | .................. | G06F 1/20 |
| | | | | 361/695 |
| 2006/0238976 A1 * | 10/2006 | Wang | .................. | H05K 7/20154 |
| | | | | 361/697 |
| 2007/0230128 A1 * | 10/2007 | Kim | .................. | F28D 15/02 |
| | | | | 361/699 |
| 2007/0285899 A1 * | 12/2007 | Cheng | .................. | G06F 1/20 |
| | | | | 361/718 |
| 2007/0285900 A1 * | 12/2007 | Cheng | .................. | G06F 1/20 |
| | | | | 361/718 |
| 2008/0024978 A1 * | 1/2008 | Suzuki | .................. | G06F 1/203 |
| | | | | 361/689 |
| 2008/0024980 A1 * | 1/2008 | Suzuki | .................. | G06F 1/203 |
| | | | | 361/691 |
| 2008/0024987 A1 * | 1/2008 | Suzuki | .................. | G06F 1/203 |
| | | | | 361/699 |
| 2008/0096399 A1 | 4/2008 | Goh | | |
| 2008/0296134 A1 * | 12/2008 | Hattori | .................. | G06F 1/1616 |
| | | | | 200/302.1 |
| 2009/0116195 A1 * | 5/2009 | Yang | .................. | H01L 23/3675 |
| | | | | 361/709 |
| 2010/0238628 A1 * | 9/2010 | Hung | .................. | G06F 1/183 |
| | | | | 361/697 |
| 2011/0103027 A1 * | 5/2011 | Aoki | .................. | H01L 23/4093 |
| | | | | 361/752 |
| 2014/0022733 A1 * | 1/2014 | Lim | .................. | H05K 7/2039 |
| | | | | 361/718 |
| 2015/0228591 A1 * | 8/2015 | Kim | .................. | H01L 24/17 |
| | | | | 257/692 |

OTHER PUBLICATIONS

Supplemental European Search Report No. 13885197; dated May 18, 2016; pp. 8.

* cited by examiner

HEAT DISSIPATION DEVICE

TECHNICAL FIELD

The present disclosure relates to the field of mobile communications, and in particular, to a heat dissipation device.

BACKGROUND

With development of the portable electronic device technologies and mobile internet, the function and performance of a portable terminal are getting close to or converging on those of a computer, the processing capacity of the terminal is stronger and stronger, and the rate for uploading and downloading over a wireless internet is becoming higher and higher. Correspondingly, the power consumption and the amount of heating of various chips in the terminal are larger and larger, and the heating of the device can greatly affect normal use of the device. Therefore, the problem of heating of the terminal device must be solved or mitigated.

In the related technologies, there is a heat dissipation scheme for terminals, in which a miniature electric fan is connected to the terminal for air convection, and hot air is blew out from a certain port of the terminal. However, relatively large space in the terminal is occupied in this scheme, thus the application of this scheme is rather limited. Another heat dissipation scheme for terminals is to connect a thermal conductive cable to a metal port with which the terminal can communicate with other electronic devices, so that heat can be dissipated through the metallic conductor. However, the communication port is usually located at the edge of the terminal, taking a micro-USB interface (Universal Serial Bus (USB)) as an example, this interface is far away from a heat generating component in the terminal and has a relatively small dimensions, therefore, it has a rather limited effect to conduct the internal heat.

For the problem that the implementing effect of heat dissipation schemes for terminals is fairly bad in the related technologies, no effective solution has been provided at present.

SUMMARY

For the problem in the related technologies that the implementing effect of heat dissipation schemes for terminals is fairly bad, a heat dissipation device is provided in the embodiments of the present disclosure to solve the technical problem above.

According to one aspect of the embodiments of the present disclosure, a heat dissipation device is provided in an embodiment of the present disclosure, wherein the heat dissipation device includes a thermal conductive plate 1, a shape of which is the same as a shape of a Secure Digital (SD) card, the thermal conductive plate 1 is used to be inserted into an SD card connector, and partially contacts with at least one inner surface of the SD card connector; wherein the thermal conductive plate 1 is made of thermal conductive metallic material, and one or more contacting parts 10 of the thermal conductive plate 1 that contact with the SD card connector are set to be thermal conductive metallic material, and outer surfaces 12, other than the one or more contacting parts 10, of the thermal conductive plate 1 is set to be insulating material.

In an example embodiment, the heat dissipation device further includes a thermal conductive cable 2 connected to the thermal conductive plate 1.

In an example embodiment, the heat dissipation device further includes an extension thermal conductive plate 3, one end of the thermal conductive cable 2 is connected to the thermal conductive plate 1, and the other end of the thermal conductive cable 2 is connected to the extension thermal conductive plate 3.

In an example embodiment, in the heat dissipation device, the extension thermal conductive plate 3 is made of metallic material or heat storage material.

The design of the embodiments of the present disclosure is reasonable. In the embodiments, the shape of the thermal conductive plate is the same as that of an SD card. After the thermal conductive plate is inserted into the SD card connector, since one or more contacting parts of the thermal conductive plate that contact with the SD card connector are set to be thermal conductive metallic material, the problem in the related technologies that the implementing effect of heat dissipation schemes for terminals is fairly bad can be solved, and the heat conduction and heat dissipation speed can be improved. The heat dissipation device provided by the embodiments of the present disclosure occupies less space in the terminal, and enhances heat dissipation efficiency.

The above description is only a summary of the technical solutions of the embodiments of the present disclosure. In order to be able to understand the technical means of the present disclosure more clearly, the technical means can be implemented according to the contents of the description, furthermore, to make the above-mentioned contents and other objectives, characteristics, and advantages of the present disclosure more comprehensible, specific embodiments of the present disclosure are descried as follows in detail.

DETAILED DESCRIPTION OF THE EMBODIMENTS

In order to solve the problem in the related technologies that the implementing effect of heat dissipation schemes for terminals is fairly bad, a heat dissipation device is provided in the embodiments of the present disclosure, and the embodiments of the present disclosure will be further described in detail hereinbelow with reference to the accompanying drawings and embodiments. It should be understood that specific embodiments described here are only used for illustrating the disclosure and not intended to limit the present disclosure.

The present embodiment describes a heat dissipation device, the heat dissipation device includes a thermal conductive plate 1, a shape of which is the same as a shape of a Secure Digital (SD) card, and the thermal conductive plate 1 is in contact with the SD card connector of a terminal to conduct heat.

Since the micro-SD card is relatively long (about 15 millimeters), if the micro-SD card is to be inserted into the terminal completely, it is required that the micro-SD card connector is about only 10 millimeters far away from an edge of a printed circuit board of the terminal and is relatively close to a heat generating circuit. Furthermore, the width of the micro-SD card is about 11 millimeters and thus the dimension of the connector is relatively large.

Figure 1:
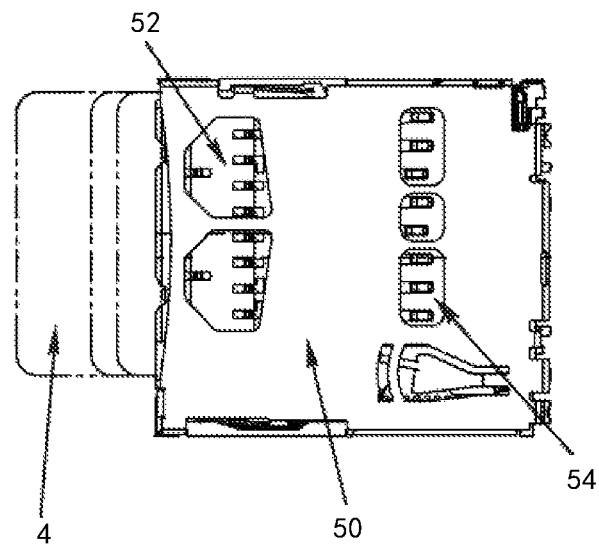
FIG. 1 is a schematic diagram of the first type of SD card connector according to an embodiment of the present disclosure.
Figure 2:
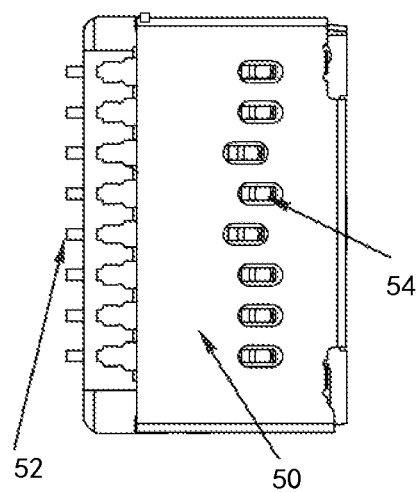
FIG. 2 is a schematic diagram of the second type of SD card connector according to an embodiment of the present disclosure.

Two types of SD card connectors are described as examples below. FIG. 1 is a schematic diagram of the first type of SD card connector according to an embodiment of the present disclosure. As shown in FIG. 1, a micro-SD card 4 is inserted into an SD card connector 5, and the SD card connector 5 includes a full metal shell 50, several connector bonding pads 52 and several shrapnel 54 for contacting the micro-SD card. FIG. 2 is a schematic diagram of the second type of SD card connector according to an embodiment of the present disclosure. As shown in FIG. 2, the SD card connector 5 includes a full metal shell 50, several connector bonding pads 52 and several shrapnel 54 for contacting the micro-SD card. It can be seen from the figures that the SD card connector 5 is provided with a large area metal shell which is in full connection with the copper covered on the surface of the printed circuit board and has a strong capability for absorbing and conducting heat from a printed board.

Figure 3:
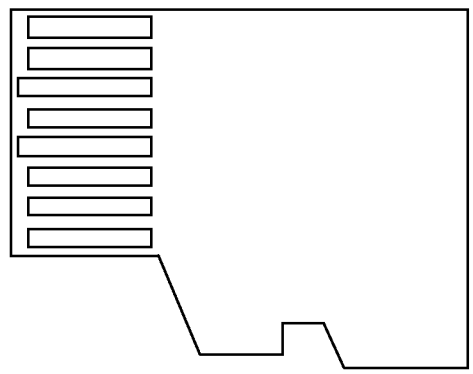
FIG. 3 is a schematic diagram of the front side of a standard micro-SD card according to an embodiment of the present disclosure.
Figure 4:
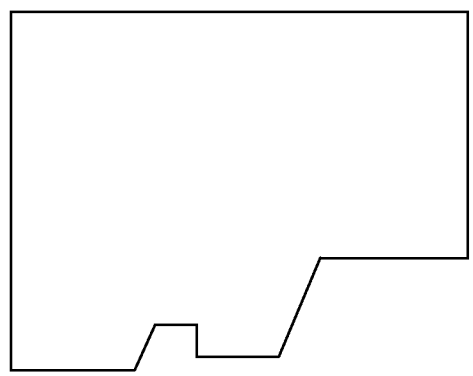
FIG. 4 is a schematic diagram of the back side of a standard micro-SD card according to an embodiment of the present disclosure.

FIG. 3 is a schematic diagram of the front side of a standard micro-SD card according to an embodiment of the present disclosure. As shown in FIG. 3, gold fingers are arranged on the left of the front side of the micro-SD card, and the golden fingers on the micro-SD card are made of metal material. FIG. 4 is a schematic diagram of the back side of a standard micro-SD card according to an embodiment of the present disclosure. The shapes of the back side and front side of the micro-SD card correspond to each other.

Figure 5:
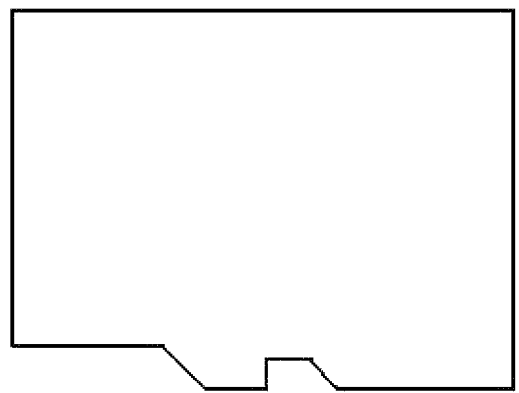
FIG. 5 is a schematic diagram of the front side of a thermal conductive plate according to an embodiment of the present disclosure.
Figure 6:
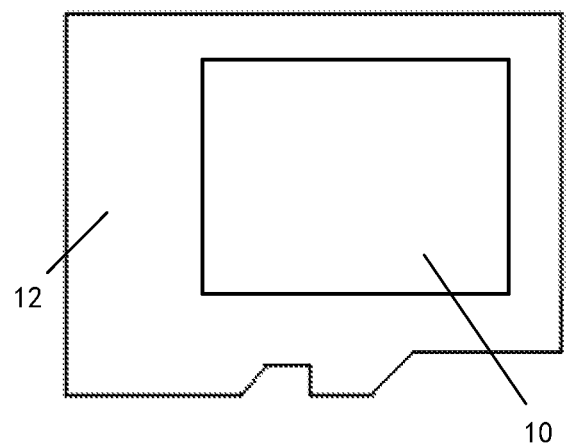
FIG. 6 is a schematic diagram of the back side of a thermal conductive plate according to an embodiment of the present disclosure.

FIG. 5 is a schematic diagram of the front side of a thermal conductive plate according to an embodiment of the present disclosure. It can be seen from the figure that the shape of the front side of the thermal conductive plate is the same as the shape of the front side of the micro-SD card. FIG. 6 is a schematic diagram of the back side of a thermal conductive plate according to an embodiment of the present disclosure. In the present embodiment, the thermal conductive plate 1 is used to be inserted into the SD card connector and partially contacts with at least one inner surface of the SD card connector. The material of the thermal conductive plate 1 is metal material with good heat transfer performance, and the surface of the front side of the thermal conductive plate 1 is processed to be insulated. It can be seen from FIG. 6 that the contacting part 10, which contacts with the SD card connector, of the thermal conductive plate 1 is set to be thermal conductive metallic material, and the outer surfaces 12 other than the contacting part 10 of the thermal conductive plate 1 are set to be insulating material.

In the present embodiment, in terms of the outer surface, the thermal conductive plate differs from the micro-SD card in that: compared with the front side of the standard micro-SD card, the part, corresponding to the gold finger part of the micro-SD card for contacting with the micro-SD card connector, on the thermal conductive plate is set to be insulated; and compared with the back side of the standard micro-SD card, the part, corresponding to the insulated part of the micro-SD card in contact with the metal shell of the connector, on the thermal conductive plate is set to be thermal conductive metallic material.

Figure 7:
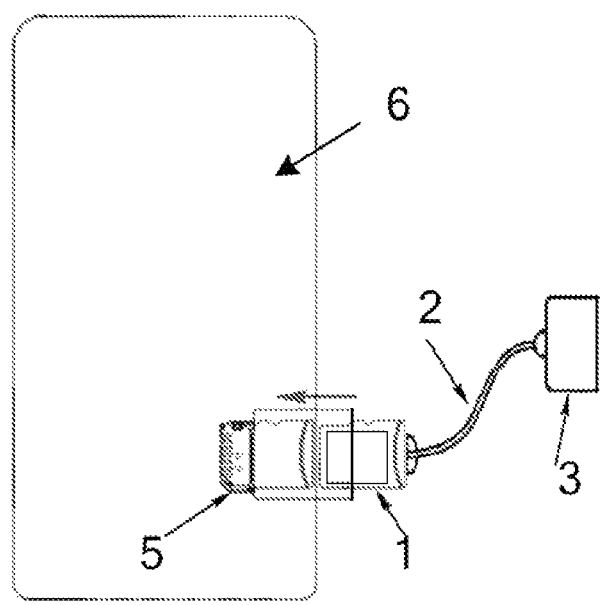
FIG. 7 is a schematic structural diagram of a heat dissipation device according to an embodiment of the present disclosure.

In order to improve the heat dissipation effect of the heat dissipation device, the heat dissipation device may further include a thermal conductive cable 2. As shown in the schematic structural diagram of FIG. 7, the thermal conductive cable 2 is connected to the thermal conductive plate 1. The thermal conductive plate 1 is inserted into the SD card connector 5 which is located in a terminal 6. In another example embodiment, the heat dissipation device may further include an extension thermal conductive plate 3, one end of the thermal conductive cable 2 is connected to the thermal conductive plate 1, and the other end of the thermal conductive cable 2 is connected to the extension thermal conductive plate 3. The extension thermal conductive plate 3 may be made of metallic material or heat storage material.

After the thermal conductive plate 1 is inserted into the SD card connector 5 in the terminal 6, the exposed metal face is in full contact with the metal shell of the SD card connector 5 to absorb and conduct heat. The thermal conductive plate 1 is connected to the external thermal conductive cable 2, so that heat can be conducted and radiated to the outside of the terminal 6. The thermal conductive cable 2 is connected to the extension thermal conductive plate 3, so that heat conduction and radiation can be further accelerated. The extension thermal conductive plate 3 may be metal material with good heat transfer performance and may also be material with strong heat storage capability. The extension thermal conductive plate 3 may be exposed in the air to dissipate heat by virtue of convection and may also be placed in water to accelerate heat dissipation. If the heat dissipation effect of the thermal conductive cable 2 is good, the extension thermal conductive plate 3 may be removed.

From the description above, it can be seen that in the heat dissipation device described in the embodiments of the present disclosure, the shape of the thermal conductive plate is the same as that of the SD card, and the heat of the terminal can be quickly conducted to the outside of the terminal by inserting the heat dissipation device into the SD card connector of the terminal.

Although the example embodiments of the present disclosure are disclosed for exemplary purposes, a person skilled in the art will recognize that various improvements, additions and substitutions are also possible; therefore, the scope of the present disclosure should be not limited to the above-described embodiments.

INDUSTRIAL APPLICABILITY

The technical solution of the embodiments of the present disclosure can be applied to the field of communications. A heat dissipation device is provided to solve the problem in the related technologies that the implementing effect of heat dissipation schemes for terminals is fairly bad, heat conduction and heat dissipation speed are improved, less space in the terminal is occupied, and the heat dissipation efficiency is enhanced.

What is claimed is:

1. A heat dissipation device, comprising a thermal conductive plate (1), a shape of which is the same as a shape of a Secure Digital (SD) card, wherein the thermal conductive plate (1) is used to be inserted into an SD card connector and partially contacts with at least one inner surface of the SD card connector;

the thermal conductive plate (1) is made of thermal conductive metallic material, and one or more contacting parts (10) of the thermal conductive plate (1) that contact with the SD card connector are set to be thermal conductive metallic material, and outer surfaces (12), other than the one or more contacting parts (10), of the thermal conductive plate (1) are set to be insulating material;

wherein when the thermal conductive plate (1) is not inserted into the SD card connector, the thermal conductive plate (1) and the SD card connector are set separately.

2. The heat dissipation device according to claim 1, wherein the heat dissipation device further comprises a thermal conductive cable (2) connected to the thermal conductive plate (1).

3. The heat dissipation device according to claim 2, further comprising an extension thermal conductive plate (3), wherein one end of the thermal conductive cable (2) is connected to the thermal conductive plate (1), and the other end of the thermal conductive cable (2) is connected to the extension thermal conductive plate (3).

4. The heat dissipation device according to claim 3, wherein the extension thermal conductive plate (3) is made of metallic material or heat storage material.

* * * * *